US005342795A

United States Patent [19]
Yuan et al.

[11] Patent Number: 5,342,795
[45] Date of Patent: Aug. 30, 1994

[54] METHOD OF FABRICATING POWER VFET GATE-REFILL

[75] Inventors: Han-Tzong Yuan; Donald L. Plumton; Tae S. Kim, all of Dallas; Jau-Yuann Yang, Richardson, all of Tex.

[73] Assignee: Texas Instruments Incorporated, Dallas, Tex.

[21] Appl. No.: 153,121

[22] Filed: Nov. 15, 1993

Related U.S. Application Data

[63] Continuation-in-part of Ser. No. 78,388, Jun. 17, 1993, which is a continuation-in-part of Ser. No. 876,252, Apr. 30, 1992, Pat. No. 5,231,037.

[51] Int. Cl.$^5$ ............................................. H01L 21/44
[52] U.S. Cl. ................................. 437/40; 437/90; 437/176; 148/DIG. 40
[58] Field of Search ................... 437/40, 41, 90, 107, 437/104, 96, 184, 133; 148/DIG. 40, DIG. 56, DIG. 126; 257/330–332, 264

[56] References Cited

U.S. PATENT DOCUMENTS

| | | | |
|---|---|---|---|
| 4,129,879 | 12/1978 | Tantraporn et al. | 357/22 |
| 4,186,410 | 1/1980 | Cho et al. | 357/67 |
| 4,427,990 | 1/1984 | Nishizawa | 357/22 |
| 4,586,240 | 5/1986 | Blackstone et al. | 29/571 |
| 4,632,710 | 12/1986 | Van Rees | 148/175 |
| 4,995,049 | 2/1991 | Kahen et al. | 372/50 |
| 5,045,502 | 9/1991 | Lau et al. | 437/184 |
| 5,077,228 | 12/1991 | Eklund et al. | 437/40 |
| 5,077,231 | 12/1991 | Plumton et al. | 437/51 |
| 5,089,431 | 2/1992 | Slatter et al. | 437/39 |
| 5,116,455 | 5/1992 | Daly | 156/605 |
| 5,122,853 | 6/1992 | Luth | 357/34 |
| 5,221,633 | 6/1993 | Holm et al. | 437/51 |
| 5,231,037 | 7/1993 | Yuan et al. | 437/40 |

FOREIGN PATENT DOCUMENTS 62-232122 10/1987 Japan.

OTHER PUBLICATIONS

S. Tiwari, "Negative Resistance, High Frequency Device", *IBM Technical Disclosure Bulletin*, vol. 26, No. 11, Apr. 1984, p. 5782.

Campbell, et al., "150 Volt Vertical Channel GaAs FET", *IEDM*, 82, pp. 258–260 (1982).

Campbell, et al., "Trapeziodal–Groove Schottky–Gate Vertical–Channel GaAs FET (GaAs Static Induction Transistor)", *IEEE Electron Device Letters*, vol. EDL–6, No. 6, Jun. 1985, pp. 304–306.

Mori, et al., "A High Voltage GaAs Power Static Induction Transistor", *Extended Abstracts of the 19th Conference on Solid State Devices and Materials*, Tokyo, 1987, pp. 279–282.

Frensley, et al., "Design and Fabrication of a GaAs Vertical MESFET", *IEEE Transactions on Electron Devices*, vol. ED–32, No. 5, May 1985, pp. 952–956.

*Primary Examiner*—George Fourson
*Assistant Examiner*—David M. Mason
*Attorney, Agent, or Firm*—Dana L. Burton; James C. Kesterson; Richard A. Stoltz

[57] ABSTRACT

This is a method of forming a vertical transistor device comprising: forming an n-type first drain/source layer 42; patterning a portion of the first drain/source layer 42 to form a channel 44 and a trench; forming a p-type gate structure 46 in the trench; and forming a n-type second drain/source layer 48 over the gate structure 46 and the channel 44; contacting the gate structure 54; forming p-ohmic contact to the gate structure 56; forming n-ohmic source contact 54; and forming n-ohmic drain contact 58. Other devices and methods are also disclosed.

13 Claims, 2 Drawing Sheets

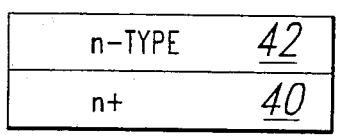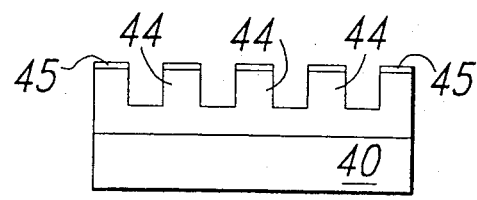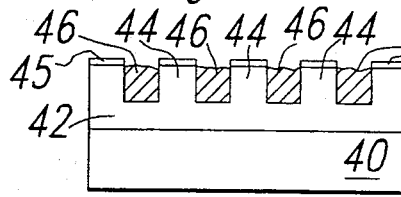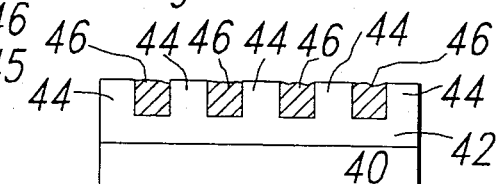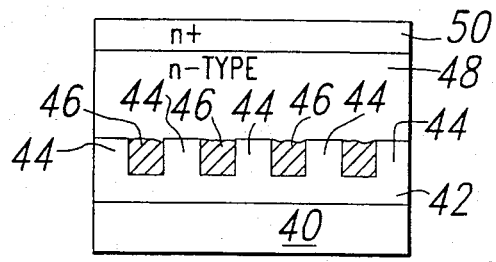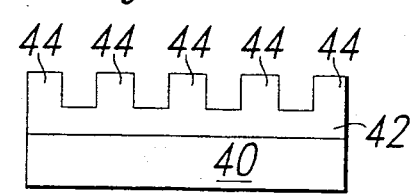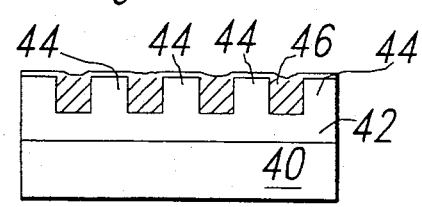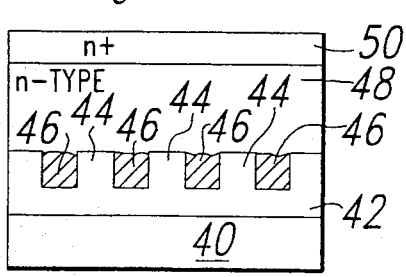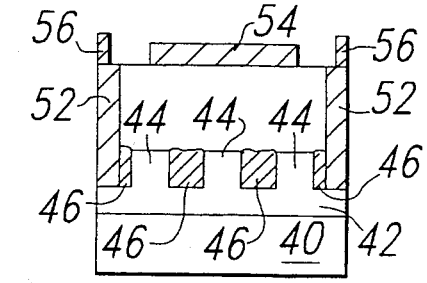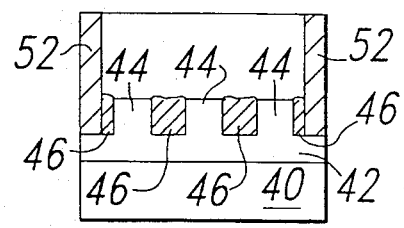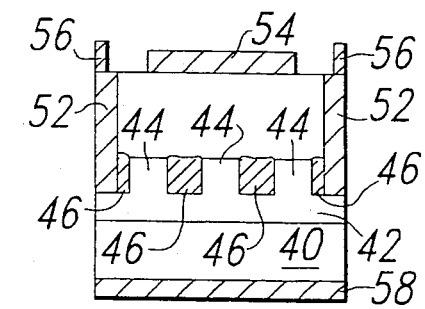

METHOD OF FABRICATING POWER VFET GATE-REFILL

This application is a continuation in part of application Ser. No. 08/078388, filed Jun. 17, 1993, which is a continuation in part of application Ser. No. 07/876252, filed Apr. 30, 1992, now U.S. Pat. No. 5,231,037.

FIELD OF THE INVENTION

This invention generally relates to the fabrication of power vertical-channel field-effect transistor (VFET) devices.

BACKGROUND OF THE INVENTION

Without limiting the scope of the invention, its background is described in connection with power FET devices, as an example.

Heretofore, in this field, as VHSIC electronics emerged, it became obvious that power distribution practices and power supply technology were not adequate to supply well regulated power to using circuitry. The concept of centralized power with decoupled loads simply has not worked well. The power distribution problem is moving from standard design techniques to real point-of-use regulators.

GaAs VFETs are attractive for high-efficiency switching power supplies. Several studies have concluded that the intrinsic devices have a factor of 5 to 8 lower on-resistance per unit area, as compared to state-of-the-art DMOS or UMOS power devices fabricated by the most advanced processes available. In addition, GaAs VFETs have excellent switching speed, on the order of 1 to 2 ns. Therefore, with such a device, the efficiency of switching power supplies can be significantly improved.

SUMMARY OF THE INVENTION

It is herein recognized that a need exists for smaller, faster power devices. Specifically, it is desired to improve the on-resistance, junction capacitance, gate resistance and gate driving voltage; and provide a low-loss, high efficiency device. It is further recognized that a need exists for minimizing the problem of interface charges, minimizing the channel doping variation, and eliminating the high temperature process in the fabrication of VFETs. The present invention is directed toward meeting those needs.

Generally, and in one form of the invention, a method is presented for fabricating a VFET, while minimizing the mentioned problems. The method comprises: forming a n-type first drain/source layer; patterning a portion of the first drain/source layer to form a channel and a trench; forming a p-type gate layer in the trench; and forming a n-type second drain/source layer over the gate layer and the channel; contacting the gate structure; forming p-ohmic contact to the gate structure; forming n-ohmic source contact; and forming n-ohmic drain contact. Preferably, the first drain/source layer is formed on a n+ substrate; a n+ cap layer is formed over the second drain/source layer; the channel and trench are formed by an ECR etch; and the first drain/source layer, the gate layer, and the second drain/source layer are GaAs and are epitaxially formed. The implanted p+ dopant may be Be; the p-ohmic contact may be AuZn; and the n-ohmic contact may be PdGeIn.

The gate layer may be selectively grown or another process, such as a growth process where the lateral growth is much higher than the vertical growth rate may be used. for the gate layer, carbon doping is preferred due to the low diffusivity of C in GaAs, but other p-type dopants may also be used. Materials other than GaAs may be used for the gate layer, such as GaInP and AlGaAs to take advantage of their etch selectivity or different selective-growth properties.

BRIEF DESCRIPTION OF THE DRAWINGS

In the drawings:

FIGS. 3a–3e are cross-sectional views, at different processing stages, of a second embodiment of this invention;

FIGS. 4a–4d are cross-sectional views, at different processing stages, of a third embodiment of this invention; and FIGS. 5a–5c are cross-sectional views, at different processing stages, of a method of forming contacts to the second and third embodiment of the present invention;

Corresponding numerals and symbols in the different figures refer to corresponding parts unless otherwise indicated.

DETAILED DESCRIPTION OF PREFERRED EMBODIMENTS

Figure 1A:
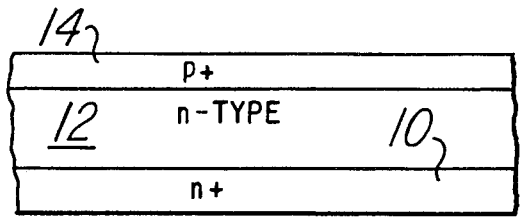
FIGS. 1a–1e are cross-sectional views, at different processing stages, of a first embodiment of this invention.
Figure 1B:
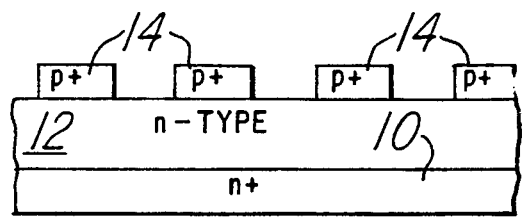

Previous demonstrations of GaAs power VFETs, other than permeable base transistors that usually have too low a breakdown voltage for power applications, used two different structures. The first approach was a buried-gate structure, which employed beryllium implantation for the gate electrode, followed by an epitaxial overgrowth for the source terminals of the device. In the second approach, all the epitaxial layers for the device were grown first. Subsequently, conduction channels were defined by mesa etch, then Schottky metal gate electrodes were evaporated on both side of the channels. Although both approaches were used successfully to fabricate GaAs VFETs with a gate pitch in the 4- to 8-$\mu$m range, it was not possible to scale down the pitch below 4 $\mu$m, because of the lateral diffusion problem of p-type dopants such as Zn, Be, and Mg in the buried-gate structure and lithographic difficulties in the mesa/Schottky gate structure. The resultant devices were suitable for high voltage operation but not for low voltage, high current applications, such as a high efficiency rectifier. Consequently, the full potential of GaAs VFETs was never realized.

The use of carbon as a low diffusion, high concentration p-type dopant dramatically broadens the potential uses of GaAs Power VFETs. Specifically, buried carbon gate electrodes may be used to design VFETs with channel openings less than 1.0 $\mu$m. Meanwhile, the high doping concentration ($\approx 10^{20}$ cm$^{-3}$) can make the gate sheet resistance acceptable for converter type ($>1$ MHz switching) rectifier applications. In comparison to the most advanced UMOS power transistors reported currently, the GaAs VFET of the present invention is superior in the four categories that are important to the design of a low-loss, high-efficiency switching power supply: on-resistance, junction capacitance, gate resistance, and gate driving voltage. Furthermore, the new GaAs VFETs can be switched in less than 2 ns, while the UMOS power devices generally require at least 50 ns to switch because of much higher gate resistance.

The GaAs VFETs fabricated by the process of the present invention will not only be superior for high-frequency switching power supplies, but also for other applications such as high-power microwave amplifiers and high-gain photodetectors. Table 1 and Table 2 below may be referred to for clarification of the element numbers in the drawings. For the sake of clarity certain layers are referred to as either source or drain layers, however, if desired these layers may be interchanged. Furthermore, a more generic term such as first and second source/drain layers may also be used.

FIGS. 1a–1e show sequential steps of a first embodiment process to fabricate the device of the present invention. As shown in FIG. 1a, an n-type epitaxial drain (or source or first drain/source) layer 12 is formed over a preferably n+ substrate 10. The thickness and dopant level of the drain layer 12 is dependent on the specific device design. However, the dopant level is generally considered n to n-. A p+ epitaxial gate layer 14 is then formed over the drain layer 12. The gate layer 14 is preferably heavily doped, with carbon, at a concentration of preferably $\approx 10^{20}$ cm$^{-3}$ or higher, but may be doped at a lower concentration such as $10^{18}$ cm$^{-3}$. Generally, the higher the dopant concentration the faster the switching and the lower the gate resistance. The gate layer 14 is preferably $\approx 250$ nm thick or thicker or reduce gate resistance. The gate layer 14 is then etched to define the gate structures 14, shown in FIG. 1b. Due to the near zero diffusion of carbon, the gate electrodes 14 may preferably be $\approx 1$ $\mu$m pitch. The resultant device will have a low-resistive, buried-gate structure with a channel opening of only 0.5 $\mu$m. Preferred lithography methods for this step include e-beam direct writing and an electron cyclotron resonance (ECR) etch to define the fine gate structure 14. Alternately, Stepper 1-line lithography could be used. An RIE process could potentially be used to etch the gate/channels.

Figure 1C:
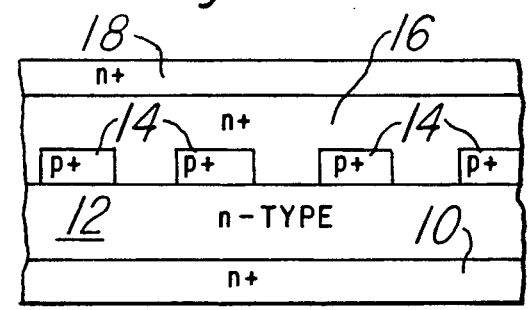
Figure 1D:
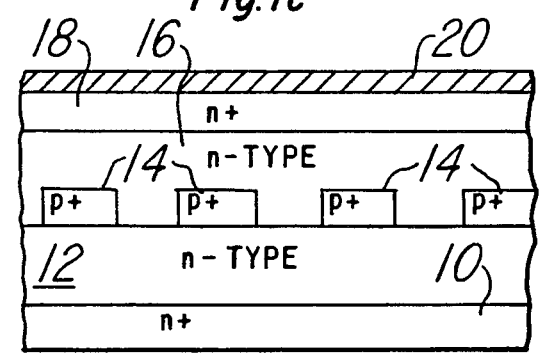
Figure 1E:
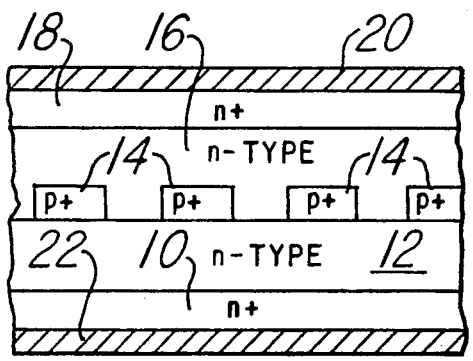

In FIG. 1c, a n-type epitaxial source (or drain or second drain/source) layer 16 is formed over the gate structures 14. The dopant concentration and thickness of the source layer 16, like the drain layer 12, is dependent on the specific device application. A n+ cap layer 18 may optionally be formed over the source layer 16 to improve phmic contact. A n++ InGaAs layer may also be added for improved contact resistance. As shown in FIG. 1d, metal contact 20 to the source 16 may be formed of, for example, non-alloyed PdGein. Other examples of contact material include AuGeN, PdGe, InGaAs with TiPtAu or WSi. The substrate 10 may then be thinned and metal contact 22 to the drain 12 may be formed on the backside of the wafer. Please note the choice of drain 12 and source 16 designations may be switched if desired.

The completed VFETs of the present invention show a gate sheet resistance of approximately only 30 ohms per square, almost two orders of magnitude lower than the gate electrodes of GaAs VFETs fabricated previously by other methods.

Figure 2A:
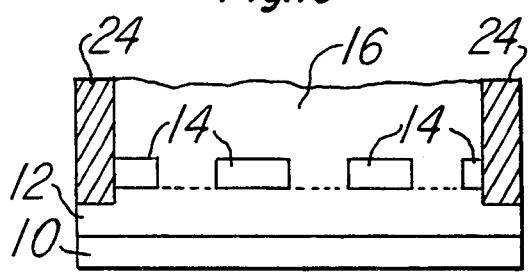
FIGS. 2a–2c are cross-sectional views, at different processing stages, of a method of forming contacts to the first embodiment of the present invention.
Figure 2B:
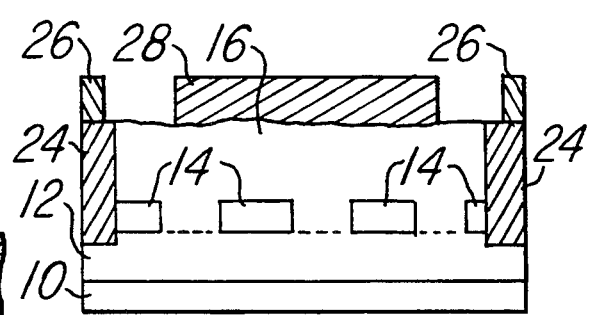
Figure 2C:
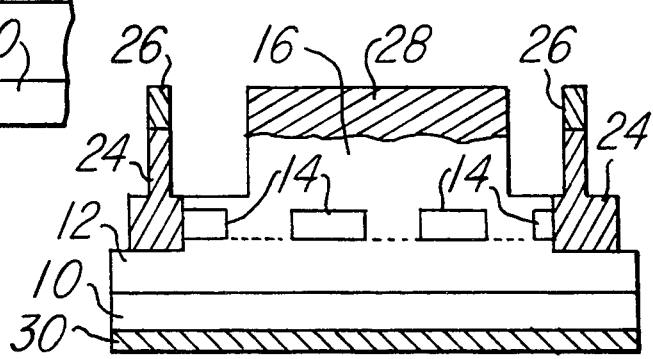

In FIGS. 2a–2c an embodiment method for forming contacts to the gates 14, the source 16, and the drain 12 of the device of the present invention. Initially, the drain layer 12 is formed, the gate layer 14 is formed and etched, and the source layer 16 is formed in the manner described above and shown in FIGS. 1a–1c. A p+ implant 24, as shown in FIG. 2a, is preferably performed to contact the gates 14. The p+ implant 24 is preferably Be, but may alternately be a dopant such as Zn or Mg. The implant 24 provides a surface which remains essentially planar and results in a low gate resistance. However, if desired, a mesa etch process could be used to contact the gates 14.

N-ohmic contact 28 to the source 16 and p-ohmic contact 26 to the gates 14 are shown in FIG. 2b. The n-ohmic contact 28 may preferably be PdGein, or alternately AuGeNi, PdGe, InGaAs with TiPtAu, or WSi. The p-ohmic contact 26 may preferably be AuZn, or alternately TiPtAu to a Zn diffused region. Shown in FIG. 2c are the preferred steps of ohmic cap etch isolation, mesa device isolation, and backside drain n-ohmic contact 30, therefore resulting in the desired electrical contact to the device. The method of contacting the device as described above, which references the device as formed in the first embodiment of the present invention, may also be used to contact devices formed by the embodiments described below and any other embodiments of the present invention.

The first embodiment of the present invention, using the buried carbon-doped gate layer may require careful control of the processes to minimize problems associated with the overgrowth-interface charges and traps, channel doping variations, and the degradation of the conductivity of the carbon-doped gate layer during the high temperature processing steps such as overgrowth and p+ implantation and annealing. Surface contaminants may give rise to a charge accumulation at the overgrowth interface, lowering the drain-gate breakdown voltage. The doping level in the channel may be difficult to control since the non-planar growth is significantly different from the planar growth, while doping calibration is done under the planar-growth conditions. Different crystal planes may appear after ECR etching of the gate layer, while the doping efficiency may depend on the crystal plane. The variations in the channel doping result in the variation of the gain and pinch-off characteristics of the device. Overgrowth of the source layer may require a high temperature desorption process to minimize the overgrowth interface problems in the channel layer. Increase in the resistivity of the gate layer, which is often observed after the high temperature processing steps, may limit the switching speed of the device.

The VFETs fabricated by the process of a second embodiment of the present invention will reduce the aforementioned problems. The channel doping variation problem may also be reduced simply by using dopants whose doping efficiencies are not sensitive to the growth plane, such as S, Sn, etc.

FIGS. 3a–3e show sequential steps of the second embodiment of the present invention to fabricate the VFETs. As shown in FIG. 3a, an n-type epitaxial drain (or source or first drain/source) layer 42 is formed over a preferably n+ substrate 40. The thickness and dopant level of the drain layer 42 is dependent on the specific device design. The drain layer 42 is then patterned and etched to form one or more trenches and channel structures 44, shown in FIG. 3b. A dry etch method, such as ECR, may be used to form the trenches. Other etch methods, such as those described in the first embodiment above may also be used. As the channel structures 44 are originally formed by the planar growth, the doping in the channel 44 may be easier to control than in the non-planar growth employed in the first embodiment.

Referring to FIG. 3c, the gate layer 46 is preferably selectively grown in the trench. A mask material 45 may be used over the channel structures 44 during the selective growth process if needed. Since the doping level in the gate layer 46 is preferably very high, the device characteristics will not be sensitive to the small variations in the doping levels. Carbon doping is preferred for GaAs due to its low diffusivity, but other dopants with relatively high diffusion coefficient may be used if the high temperature processing steps are eliminated. As the growth selectivity is different for different materials, other materials such as GaInP and AlGaAs may be used as the gate, source or drain material. Using such materials is also advantageous as they have shown etch selectivity.

After the selective growth of the gate layer 46, the top of the channel structures 44 are exposed, for example, by removing mask material 45, shown in FIG. 3d. The n-type source (or drain or second drain/source) layer 48 and optional n+ cap layer 50 are preferably overgrown, shown in FIG. 3e. The source layer 48 and optional n+ cap layer 50 can be selectively overgrown by masking the gate contact area with a masking film such as silicon nitride, silicon dioxide, aluminum oxide, tungsten silicide, etc. As in the first embodiment, the drain and source may be switched if desired. If a drain-down configuration is chosen the channel overgrowth interface will be at the source-gate side rather than at drain-gate side, therefore, the drain-gate breakdown voltage will not be affected by the presence of the interface charge at the channel overgrowth interface. The interface charge is apparently induced by the surface contaminants. As the surface impurity desorption is less a problem with the approach in this embodiment, a high temperature desorption process, which may be used in the conventional overgrowth process, can be eliminated.

In a third embodiment, an n-type epitaxial drain (or source or first drain/source) layer 42 is formed over a preferably n+ substrate 40, as shown for the second embodiment in FIG. 3a. The thickness and dopant level of the drain layer 42 is dependent on the specific device design. The drain layer 42 is then patterned and etched to form one or more trenches and channel structures 44, as shown for the second embodiment in FIG. 3b.

In the third embodiment, the gate layer 46 is not selectively grown, as in the second embodiment, but grown under such conditions that give significantly higher growth rate in the lateral direction than in the vertical direction. The top of the channel structures 44 are then exposed prior to the overgrowth of the source (or drain or second source/drain) layer 48 and optional n+ cap layers 50 by etching the thin p-type layer grown on top of the channel layer. FIGS. 4a–4d show the sequential steps.

In both the second and third embodiments the n+ cap layer 50 is optional and may be formed over the source layer 48 to improve ohmic contact. A n++ InGaAs layer (not shown) may also be added for improved contact resistance. Metal contact to the source 46 may be formed of, for example, non-alloyed PdGein (not shown-see FIG. 1e). Other examples of contact material include AuGeN, PdGe, InGaAs with TiPtAu or WSi. The substrate 40 may then be thinned and metal contact to the drain 42 may be formed on the backside of the wafer (not shown-see FIG. 1e).

In FIGS. 5a–5c a method for forming contacts to the gates 46, the drain (first drain/source) 42, and the source (second drain/source) 48 of the device of the second and third embodiments of the present invention is shown. Initially, the device is formed in the manner described above for the second or third embodiment and shown in FIGS. 3a–3e and 4a–4d. A p+ implant 52, as shown in FIG. 5a, may be performed to contact the gates 46. The p+ implant 52 is preferably Be, but may alternately be a dopant such as Zn or Mg. The implant 52 provides a surface which remains essentially planar and results in a low gate resistance. The implantation and associated annealing process, which may be used to form a contact to the gate layer 46 through the source layer 48 and optional n+ cap layer 50, may be eliminated by either selective growth (not shown) or selective etching (not shown) of the source layer 48 and optional n+ cap layer 50.

N-ohmic contact 54 to the drain 42 and p-ohmic contact 56 to the gates 46 are shown in FIG. 5b. The n-ohmic contact 54 may preferably be PdGeIn, or alternately AuGeNi, PdGe, InGaAs with TiPtAu, or WSi. The p-ohmic contact 56 may preferably be AuZn, or alternately TiPtAu to a Zn diffused region. Shown in FIG. 5c is backside drain n-ohmic contact 58, therefore resulting in the desired electrical contact to the device. If desired the steps of ohmic cap etch isolation and mesa device isolation may be included (not shown-see FIG. 2c).

Several embodiments have been described in detail hereinabove. It is to be understood that the scope of the invention also comprehends embodiments different from those described, yet within the scope of the claims. For example, the n type dopant, while preferably silicon, could be a material such as S, or Se. Similarly, the GaAs could be replaced with a material such as InGaAs, InP, or GainP. Alternately, a combination of GaAs as the source and gate layers with alternative drain materials such as InGaAs, InP, or GainP could be used. Words of inclusion are to be interpreted as nonexhaustive in considering the scope of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

TABLE 1

| ELEMENT NO. | (First Embodiment) DESCRIPTION |
|---|---|
| 10 | SUBSTRATE |
| 12 | FIRST DRAIN/SOURCE LAYER |
| 14 | GATE LAYER/STRUCTURES |
| 16 | SECOND DRAIN/SOURCE LAYER |
| 18 | CAP LAYER |
| 20 | METAL CONTACT TO FIRST DRAIN/SOURCE |
| 22 | METAL CONTACT TO SECOND DRAIN/SOURCE |
| 24 | P+ IMPLANT |
| 26 | GATE P-OHMIC CONTACT |
| 28 | FIRST DRAIN/SOURCE N-OHMIC CONTACT |
| 30 | SECOND DRAIN/SOURCE N-OHMIC CONTACT |

TABLE 2

(Second and Third Embodiments)

| ELEMENT NO. | DESCRIPTION |
| --- | --- |
| 40 | SUBSTRATE |
| 42 | FIRST DRAIN/SOURCE LAYER |
| 44 | CHANNEL |
| 45 | MASKING MATERIAL |
| 46 | GATE LAYER |
| 48 | SECOND DRAIN/SOURCE LAYER |
| 50 | N+ CAP LAYER |
| 52 | P+ IMPLANT |
| 54 | METAL CONTACT TO FIRST DRAIN/SOURCE |
| 56 | GATE P-OHMIC CONTACT |
| 58 | SECOND DRAIN/SOURCE N-OHMIC CONTACT |

What is claimed is:

1. A method of forming a vertical transistor device comprising:

forming a n-type first drain/source layer over a substrate;

patterning a portion of said first drain/source layer to form a channel and a trench;

forming a p-type carbon doped gate structure in said trench;

forming a n-type second drain/source layer over said gate structure and said channel;

contacting said gate structure;

forming p-ohmic contact to said gate structure;

forming n-ohmic source contact; and forming n-ohmic drain contact.

2. The method of claim 1, wherein said first drain/source layer is formed on a n+ substrate.

3. The method of claim 1, wherein a cap layer is formed over said second drain/source layer.

4. The method of claim 3, wherein said cap layer has n+ doping.

5. The method of claim 1, wherein said channel and said trench are formed by a dry etch process.

6. The method of claim 1, wherein said gate structure is selectively grown.

7. The method of claim 1, wherein said gate structure is grown such that the lateral growth rate is higher than the vertical growth rate.

8. The method of claim 1, wherein said contacting said gate structure is done by implanting a p+ dopant.

9. The method of claim 8, wherein said implanted p+ dopant is Be.

10. The method of claim 1, wherein said contacting said gate structure is preceded by a mesa etch process.

11. The method of claim 1, wherein said p-ohmic contact is AuZn.

12. The method of claim 1, wherein said n-ohmic contact is PdGein.

13. The method of claim 1, wherein said first drain/source layer, said gate structure, and said second drain/source layer are GaAs.

* * * * *